(12) United States Patent
Zhang et al.

(10) Patent No.: US 10,903,249 B2
(45) Date of Patent: Jan. 26, 2021

(54) ARRAY SUBSTRATE AND MANUFACTURING METHOD THEREOF, DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Wei Zhang, Beijing (CN); Hui Li, Beijing (CN); Tianlei Shi, Beijing (CN); Jonguk Kwak, Beijing (CN); Yezhou Fang, Beijing (CN); Wenlong Zhang, Beijing (CN); Xu Zhang, Beijing (CN); Zhijun Niu, Beijing (CN); Ruize Jiang, Beijing (CN); Yanwei Ren, Beijing (CN); Yu Liu, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 17 days.

(21) Appl. No.: 16/325,158

(22) PCT Filed: Mar. 29, 2018

(86) PCT No.: PCT/CN2018/081094
§ 371 (c)(1),
(2) Date: Feb. 12, 2019

(87) PCT Pub. No.: WO2018/214645
PCT Pub. Date: Nov. 29, 2018

(65) Prior Publication Data
US 2019/0172854 A1 Jun. 6, 2019
US 2020/0227446 A9 Jul. 16, 2020

(30) Foreign Application Priority Data
May 22, 2017 (CN) .......................... 2017 1 0364266

(51) Int. Cl.
H01L 21/12 (2006.01)
H01L 27/12 (2006.01)
(Continued)

(52) U.S. Cl.
CPC .... H01L 27/1255 (2013.01); G02F 1/136204 (2013.01); H01L 27/0288 (2013.01);
(Continued)

(58) Field of Classification Search
CPC ............. H01L 27/1255; H01L 27/3265; H01L 27/0288; H01L 27/3276; G02F 1/136204
See application file for complete search history.

(56) References Cited

U.S. PATENT DOCUMENTS 8,063,865 B2 11/2011 Ishii et al.
2006/0038181 A1 2/2006 Tseng
(Continued)

FOREIGN PATENT DOCUMENTS

CN 102967978 A 3/2013
CN 102981340 A 3/2013
(Continued)

OTHER PUBLICATIONS

PCT International Search Report, Application No. PCT/CN2018/081094, dated Jul. 27, 2018, 6 pages: with English translation.
(Continued)

*Primary Examiner* — William Coleman
(74) *Attorney, Agent, or Firm* — Armstrong Teasdale LLP

(57) ABSTRACT

An array substrate including a plurality of terminals, a first conductive layer and a second conductive layer, wherein the first conductive layer and the second conductive layer
(Continued)

include an insulating layer therebetween, wherein a plurality of first electrode plates and a plurality of second electrode plates are formed in the first conductive layer and the second conductive layer, respectively, the first electrode plates and the second electrode plates are opposite to each other to constitute a capacitor structure, the terminals are provided in the same layer as the first conductive layer or the second conductive layer, or the terminals are provided in the same layer as a third conductive layer between the first conductive layer and the second conductive layer. A method of manufacturing an array substrate and a display device is provided.

20 Claims, 2 Drawing Sheets

(51) Int. Cl.
H01L 27/02 (2006.01)
G02F 1/1362 (2006.01)
H01L 27/32 (2006.01)
G02F 1/1368 (2006.01)

(52) U.S. Cl.
CPC ...... *H01L 27/1244* (2013.01); *H01L 27/1259* (2013.01); *H01L 27/3265* (2013.01); *G02F 1/1368* (2013.01); *H01L 27/3276* (2013.01)

(56) References Cited

U.S. PATENT DOCUMENTS

| | | | |
|---|---|---|---|
| 2006/0118787 A1* | 6/2006 | Lee | H01L 27/124 257/66 |
| 2007/0257592 A1* | 11/2007 | Li | B82Y 10/00 313/311 |
| 2016/0233253 A1* | 8/2016 | Kim | H01L 27/1274 |
| 2016/0307979 A1* | 10/2016 | Lee | H01L 27/1222 |
| 2018/0173064 A1* | 6/2018 | Ohori | H01L 29/78675 |
| 2018/0174647 A1* | 6/2018 | Takahashi | G09G 3/36 |

FOREIGN PATENT DOCUMENTS

| | | |
|---|---|---|
| CN | 105388648 A | 3/2016 |
| CN | 205385018 U | 7/2016 |
| CN | 107315293 A | 11/2017 |
| JP | 08152652 A | 6/1996 |
| JP | 2008111924 A | 5/2008 |

OTHER PUBLICATIONS

PCT Written Opinion, Application No. PCT/CN2018/081094, dated Jul. 26, 2018, 6 pages.: with English translation of relevant part.
China First Office Action, Application No. 201710364266.8, dated Sep. 3, 2019, 16 pps.: with English translation.

* cited by examiner

ARRAY SUBSTRATE AND MANUFACTURING METHOD THEREOF, DISPLAY DEVICE

CROSS REFERENCE TO RELATED APPLICATIONS

This patent application is a National Stage Entry of PCT/CN2018/081094 filed on Mar. 29, 2018, which claims the benefit and priority of Chinese Patent Application No. 201710364266.8 filed on May 22, 2017, the disclosures of which are incorporated by reference herein in their entirety as part of the present application.

BACKGROUND

The present disclosure relates to, but is not limited to, the field of display technology, and in particular, to an array substrate and a manufacturing method thereof, and a display device.

With the development and application of liquid crystal displays, Electrostatic Discharge (ESD) has become a technical problem of high-end liquid crystal displays. On the one hand, in the process of device manufacturing, due to the process characteristics thereof, it is easy to generate static electricity and result in product loss. On the other hand, components such as integrated circuits (ICs) and electronic circuits in liquid crystal modules (LCMs) are also susceptible to interference from electrostatic shock. Therefore, for liquid crystal devices, especially information communication products having liquid crystal devices, electrostatic shock resistance has become a compulsory item.

In cell processes of liquid crystal displays, module processes and reliability intentionally or unintentionally experience ESD, for example, in the process of product lighting, irreversible damage may be caused to the panel due to an instantaneous high current, environmental static electricity or device static electricity, affecting product yield and greatly increasing product cost. In addition, during product test, electrostatic breakdown may often be caused to product test terminals (ET Pads), resulting in abnormal product display and abnormal color.

BRIEF DESCRIPTION

Embodiments of the present disclosure provide an array substrate and a manufacturing method thereof, and a display device.

A first aspect of an embodiment of the present disclosure provides an array substrate. The array substrate includes a plurality of terminals, a first conductive layer, a second conductive layer, and an insulating layer between the first conductive layer and the second conductive layer, wherein a plurality of first electrode plates and a plurality of second electrode plates are disposed in the first conductive layer and the second conductive layer, respectively, and the first electrode plates and the second electrode plates are opposite to each other to form a capacitor structure, the terminals are disposed in one of the following ways: the terminal are disposed in the same layer as the first conductive layer or the second conductive layer, and the terminals are disposed in the same layer as a third conductive layer between the first conductive layer and the second conductive layer.

According to the embodiments of the present disclosure, the terminals are provided in the same layer as the first conductive layer, the first electrode plates and the terminals are alternately arranged, and an insulating material is filled between the terminal and the first electrode plate. According to the embodiments of the present disclosure, the terminals are provided in the same layer as the second conductive layer, the second electrode plates and the terminals are alternately arranged, and an insulating material is filled between the terminal and the second electrode plate.

According to the embodiments of the present disclosure, the array substrate further includes a fourth conductive layer, wherein leads of the terminal are disposed in the fourth conductive layer and are connected to the terminals through vias.

According to the embodiments of the present disclosure, the terminals are provided in the same layer as the third conductive layer between the first conductive layer and the second conductive layer, and the leads of the terminals are disposed in the third conductive layer.

According to the embodiments of the present disclosure, through holes are disposed at positions corresponding to the terminals on each layer above the terminals to expose the terminals.

According to the embodiments of the present disclosure, an orthographic projection of the through holes on a base substrate of the array substrate at least partially covers the terminals.

According to the embodiments of the present disclosure, the array substrate includes the base substrate, a buffer layer, a TFT transistor, a planarization layer, an anode metal layer, a pixel defining layer, an organic light-emitting layer, and a cathode, wherein the TFT transistor includes a source electrode, a drain electrode, a gate electrode, an active layer and a gate insulating layer, wherein the first conductive layer, the second conductive layer, and the third conductive layer are selected from any one of the following layers: the source electrode or the gate electrode, the drain electrode, the active layer, the anode metal layer, the organic light-emitting layer, and the cathode.

A second aspect of an embodiment of the present disclosure provides a display device. The display device is included in any array substrate described in the first aspect of the present disclosure.

A third aspect of an embodiment of the present disclosure provides a method of manufacturing an array substrate. The method of manufacturing the array substrate includes forming a plurality of first electrode plates in a first conductive layer, forming a plurality of second electrode plates respectively opposite to the first electrode plates in a second conductive layer, wherein the first electrode plates and the second electrode plates constitute a capacitor structure, forming a plurality of terminals in the first conductive layer or the second conductive layer, or forming a plurality of terminals in a third conductive layer between the first conductive layer and the second conductive layer.

According to the embodiments of the present disclosure, a plurality of terminals are formed in the first conductive layer, the first electrode plates and the terminals are alternately arranged, and an insulating material is filled between the terminal and the first electrode plate. According to the embodiments of the present disclosure, a plurality of terminals are formed in the second conductive layer, the second electrode plates and the terminals are alternately arranged, and an insulating material is filled between the terminal and the second electrode plate.

According to the embodiments of the present disclosure, the method further includes forming leads of the terminals in a fourth conductive layer, the leads of the terminals being connected to the terminals through vias.

According to the embodiments of the present disclosure, forming a plurality of terminals in a third conductive layer between the first conductive layer and the second conductive layer further includes forming leads of the terminals in the third conductive layer.

DETAILED DESCRIPTION

Figure 1:
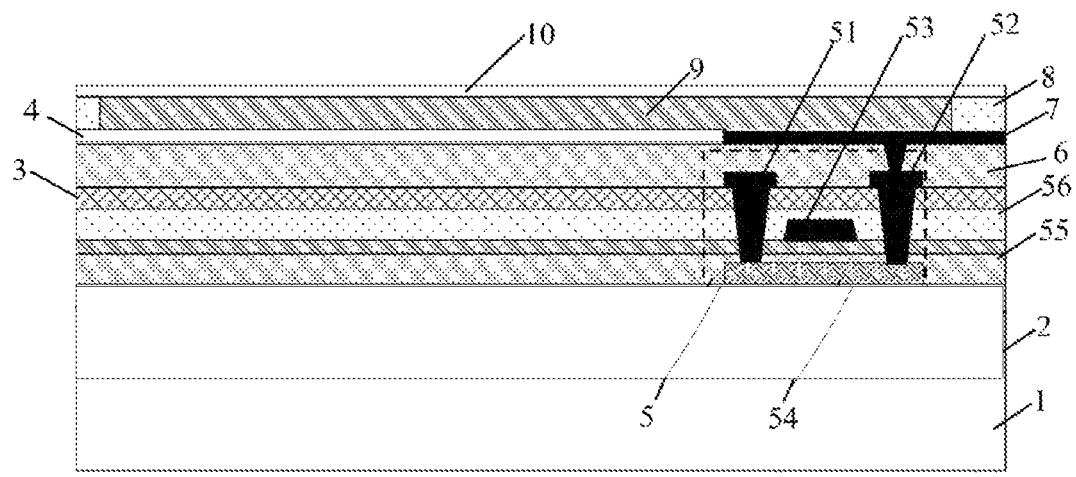
FIG. 1 shows a schematic diagram of the structure of a related array substrate.

In order to make the technical solutions and advantages of the present disclosure clearer, embodiments of the present disclosure will be described in detail below in conjunction with the accompanying drawings. It should be noted that, without conflict, the embodiments in the present disclosure and the features in the embodiments may be arbitrarily combined with each other.

The flow chart depicted in the present disclosure is merely an example. Many variations of the flow chart or the steps described therein may exist without departing from the spirit of the disclosure. For example, the steps may be performed in a different order, or steps may be added, deleted, or modified. These variations are considered to be parts of the claimed aspect.

Unless otherwise explicitly stated in the context, the singular form of the words used in this article and the appended claims includes the plural and vice versa. Thus, when reference is made to the singular, the plural of the corresponding is usually included. Similarly, the terms "including," "comprising," "containing," and "having" and grammatical variants thereof are intended to be inclusive and indicate that there may be elements other than those listed. Where the term "example" is used herein, particularly when it is placed after a group of terms, the "example" is merely exemplary and illustrative and should not be considered to be exclusive. The terms "first", "second", "third" and the like are used for the purpose of description only and are not to be construed to indicate or imply the relative importance and order of formation.

With the development and application of liquid crystal displays, it is necessary to increase electrostatic discharge (ESD) capability from external touch (GFF) products to In Cell products, to reduce product damage. In an embodiment of the present disclosure, array processes are used to increase circuit wiring in the upper and lower film layers of the terminals to form a capacitor structure, thereby protecting the terminals, avoiding electrostatic damage, improving product yield, increasing profit, and improving anti-ESD capability at product test terminals (ET Pads).

According to the technical solution of the present disclosure, a capacitor structure may be formed in any two conductive layers in the array substrate, and the terminals may be formed in the same conductive layer as the electrode plates of the capacitor structure, and may also be formed in a conductive layer between capacitor structures.

ESD is usually caused by environment and friction. After a capacitor structure is formed, ESD is preferentially performed through the capacitor structure instead of terminals such as ET pads. Static electricity is then released to GND through the capacitor so that the product is not damaged. The principle of designing on the same layer is the same. If the capacitor structure is connected to GND during the same layer design, static electricity is more likely to discharge on the capacitor instead of on the ET pads.

The array substrate of the embodiments of the present disclosure may include a plurality of terminals, a first conductive layer and a second conductive layer, and an insulating layer may be included between the first conductive layer and the second conductive layer. A plurality of first electrode plates and a plurality of second electrode plates constituting a capacitor structure are formed in the first conductive layer and the second conductive layer respectively, and the first electrode plates and the second electrode plates are opposite to each other to constitute a capacitor structure. The capacitor structure corresponds to at least one terminal, that is, the terminal is adjacent to the capacitor structure, and the capacitor structure can protect the terminal to avoid the influence of electrostatic discharge. The terminals may be provided in the same layer as the first conductive layer or the second conductive layer, or the terminals may be provided in the same layer as a third conductive layer between the first conductive layer and the second conductive layer. It should be understood that, herein, the term "provided in the same layer" means "formed from the same film layer".

FIG. 1 shows a schematic diagram of the structure of a related array substrate. As shown in FIG. 1, the array substrate generally includes a base substrate 1, a buffer layer 2, a TFT transistor 5, a planarization layer 6, an anode metal layer 7, a pixel defining layer 8, an insulating layer 4 and an organic light-emitting layer 9, and a cathode 10. The TFT transistor 5 may include a source electrode 51, a drain electrode 52, a gate electrode 53, an active layer 54, and a gate insulating layer 55. The array substrate may also include a gate isolation layer 56 and an insulating layer 3. An anode and a blocking layer may be formed in the anode metal layer 7. Of course, different array substrates are not limited to the above structure.

The conductive layers mentioned in the embodiment of the present disclosure may be any of the following layers: the layer forming the source electrode 51, the layer forming the drain electrode 52, the layer forming the gate electrode 53, the active layer 54, the anode metal layer 7, the organic light-emitting layer 9, and the layer forming the cathode 10.

Figure 2:
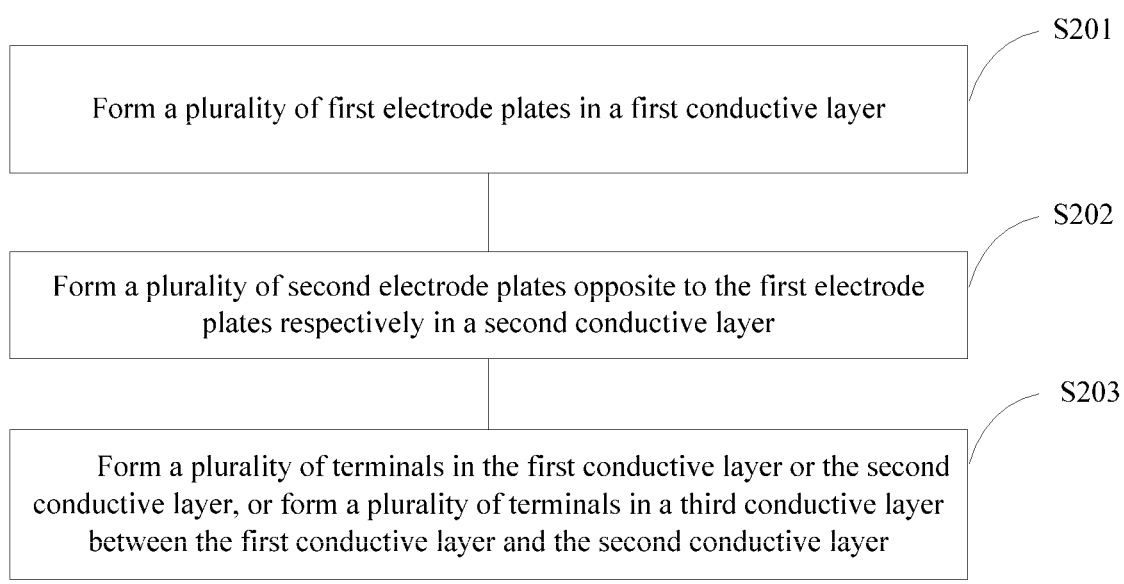
FIG. 2 illustrates a flow chart of a method of manufacturing an array substrate according to an embodiment of the present disclosure.

Embodiments of the present disclosure also provide a method of manufacturing an array substrate, and FIG. 2 illustrates a flow chart of a method of manufacturing an array substrate according to an embodiment of the present disclosure. As shown in FIG. 2, the manufacturing method may include the following steps:

Step S201, forming a plurality of first electrode plates in the first conductive layer, for example, patterning the first conductive layer to form the first electrode plates;

Step S202, forming a plurality of second electrode plates opposite to the first electrode plates respectively in the second conductive layer, wherein the first electrode plates and the second electrode plates may constitute a capacitor structure, for example, the second conductive layer is patterned to form the second electrode plates; and Step S203, forming a plurality of terminals in the first conductive layer or the second conductive layer, or forming a plurality of terminals in a third conductive layer between the first conductive layer and the second conductive layer, the capacitor structure corresponding to at least one terminal, for example, patterning the first conductive layer, the second conductive layer, and the third conductive layer to form terminals.

The steps of the above manufacturing method do not limit the order of execution.

The array substrate of the present disclosure will be described in detail below by way of example.

Figure 3:
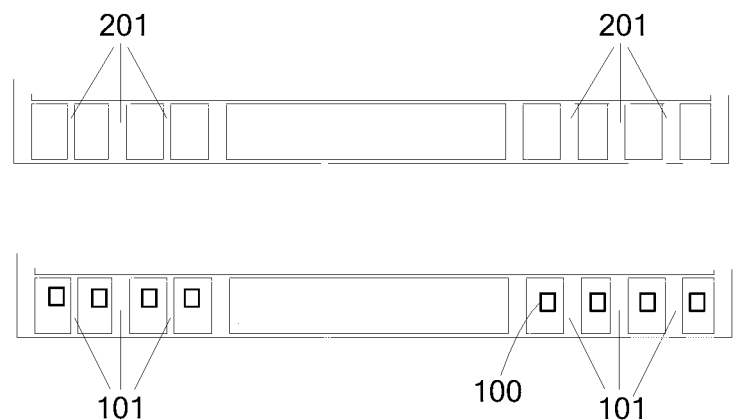
FIG. 3 shows a schematic diagram of an array substrate according to an embodiment of the present disclosure.

FIG. 3 shows a schematic diagram of an array substrate according to an embodiment of the present disclosure. As shown in FIG. 3, in the present embodiment, the terminals 100 are provided in the same layer as the electrode plates 101 constituting the capacitor structure, for example, the terminals 100 and the electrode plates 101 may be formed in the layer in which the source electrode 51 is formed. As shown in FIG. 3, the terminals 100 and the electrode plates 101 are alternately arranged, and in order to avoid a short circuit between the terminal 100 and the electrode plate 101, an insulating material may be filled between the terminal 100 and the electrode plate 101.

The electrode plates 201 are opposite to the electrode plates 101 to constitute a capacitor structure. For example, a plurality of electrode plates 201 may be formed in the anode metal layer 7.

In the present embodiment, leads of the terminals 100 are formed in other conductive layer to avoid a short circuit between the leads of the terminals 100 and the capacitor structure. For example, the leads of the terminals 100 are provided in the same layer as the active layer 54, vias (not shown) are formed through the layers between the active layer 54 and the layer forming the source electrode 51, and the leads of the terminals 100 are connected to the terminal 100 through the vias.

In the present embodiment, looking upward by taking the base substrate 1 as a bottom layer, in the layers above the terminal 100, through holes are formed at positions corresponding to the terminals 100, and the through holes are used to expose the terminals 100 so that external pins can contact the terminals 100.

In the present embodiment, the orthographic projection of the through holes on the base substrate 1 at least partially covers the terminals 100. The size of the through hole is not limited as long as the terminals 100 can be exposed.

The method of manufacturing the array substrate shown in FIG. 3 may include the following steps:

forming the buffer layer 2 on the base substrate 1, forming the TFT transistor 5 on the buffer layer 2, forming the leads of the terminals 100 in the active layer 54 of the TFT transistor 5, forming a plurality of electrode plates 101 and a plurality of terminals 100 in a layer forming the source electrode 51 of the TFT transistor 5, forming a blocking layer (not shown) at a position opposite above or below the TFT transistor sequentially forming the anode, the organic light-emitting layer 9 and the cathode 10 on the base substrate 1 after the TFT transistor 5 is formed, and forming a plurality of electrode plates 201 opposite to the electrode plates 101 in the anode metal layer 7 forming the anode.

Figure 4:
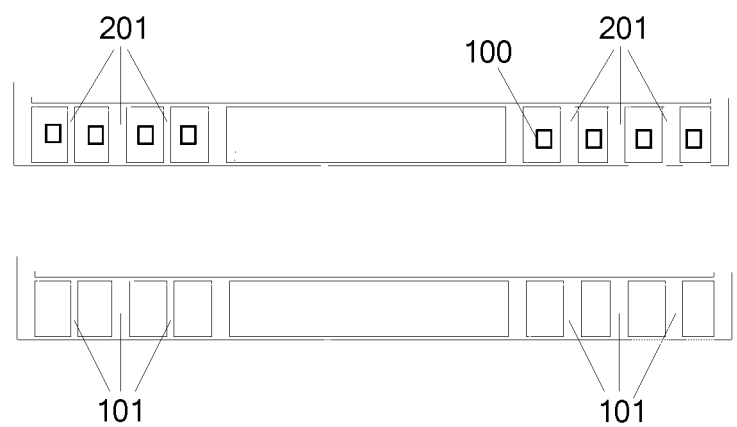
FIG. 4 shows a schematic diagram of an array substrate according to another embodiment of the present disclosure.

FIG. 4 shows a schematic diagram of an array substrate according to another embodiment of the present disclosure. The array substrate shown in FIG. 4 differs from the array substrate shown in FIG. 3 in that the terminals 100 are provided in the same layer as the electrode plates 201.

In the present embodiment, a plurality of electrode plates 101 may be formed in the active layer 54, leads of the terminals 100 are formed in the anode metal layer 7, and a plurality of terminals 100 and a plurality of electrode plates 201 opposite to a plurality of electrode plates 101 are formed in the layer forming the cathode 10. The electrode plates 101 and the opposite electrode plates 201 constitute a capacitor structure.

The terminals 100 and the electrode plates 201 are alternately arranged, and an insulating material is filled between the terminal 100 and the electrode plate 201 in order to avoid a short circuit between the terminal 100 and the electrode plate 201.

Vias are formed through the layers between the anode metal layer 7 and the layer forming the cathode 10, and the leads of the terminals 100 are connected to the terminals 100 through the vias.

In the present embodiment, looking upward by taking the base substrate 1 as a bottom layer, in the layers above the terminal 100, through holes are formed at positions corresponding to the terminals 100 to expose the terminals 100.

The orthographic projection of the through holes on the base substrate 1 at least partially covers the terminals 100, and the size of the through holes is not limited as long as the terminals 100 can be exposed.

The method of manufacturing the array substrate shown in FIG. 4 may include the following steps:

forming the buffer layer 2 on the base substrate 1, forming the TFT transistor 5 on the buffer layer 2, forming a plurality of electrode plates 101 in the active layer 54 forming the TFT transistor 5, forming a blocking layer (not shown) at a position opposite above or below the TFT transistor 5, sequentially forming the anode, the pixel defining layer 8, the organic light-emitting layer 9 and the cathode 10 on the base substrate 1 after the TFT transistor 5 is formed, forming the leads of the terminals 100 in the anode metal layer 7 forming the anode, and forming a plurality of terminals 100 and a plurality of electrode plates 201 opposite to the electrode plates 101 in the layer forming the cathode 10.

The terminals in the embodiments of the present disclosure may also be formed in a conductive layer between the two electrode plates of the capacitor structure.

Figure 5:
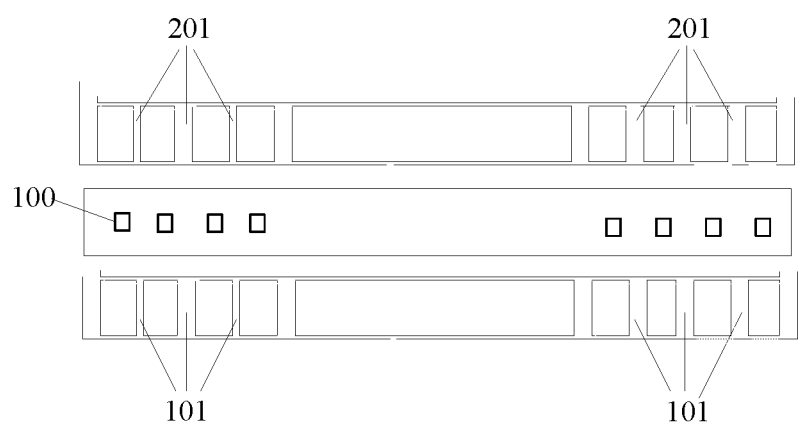
FIG. 5 shows a schematic diagram of an array substrate according to yet another embodiment of the present disclosure.

FIG. 5 shows a schematic diagram of an array substrate according to yet another embodiment of the present disclosure. As shown in FIG. 5, in the present embodiment, a plurality of electrode plates 101 may be formed in the active layer 54, a plurality of terminals 100 and leads of the terminals 100 may be formed in the layer forming the gate electrode 53, a plurality of electrode plates 201 opposite to the electrode plates 101 are formed in the anode metal layer 7, and the electrode plates 101 and the opposite electrode plates 201 constitute a capacitor structure.

In the present embodiment, looking upward by taking the base substrate 1 as a bottom layer, in the layers above the terminal 100, through holes are formed at positions corresponding to the terminals 100 to expose the terminals 100.

The orthographic projection of the through holes on the base substrate 1 at least partially covers the terminals 100, and the size of the through holes is not limited as long as the terminals 100 can be exposed.

The method of manufacturing the array substrate shown in FIG. 5 may include the following steps:

forming the buffer layer 2 on the base substrate 1, forming the TFT transistor 5 on the buffer layer 2, forming a plurality of electrode plates 101 in the active layer 54 forming the TFT transistor 5, forming a plurality of terminals 100 and the leads of the terminals 100 in the layer forming the gate electrode 53, forming a blocking layer (not shown) at a position opposite above or below the TFT transistor 5, sequentially forming the anode, the pixel defining layer 8, the organic light-emitting layer 9 and the cathode 10 on the base substrate 1 after the TFT transistor 5 is formed, and forming a plurality of electrode plates 201 in the anode metal layer 7 forming the anode, the electrode plates 201 being opposite to the electrode plates 101.

The above embodiments are merely exemplary, and the two electrode plates of the capacitor structure may be formed in any two electrically conductive layers on the array substrate.

One of ordinary skill in the art will appreciate that all or part of the above steps in the method may be accomplished by a program that instructs the associated hardware, and the program may be stored in a computer readable storage medium, such as a read-only memory, a magnetic disk, or an optical disk. Alternatively, all or part of the steps of the above embodiments may also be implemented using one or more integrated circuits. Correspondingly, each module/unit in the above embodiment may be implemented in the form of hardware or in the form of a software functional modules. The present disclosure is not limited to any specific form of combination of hardware and software.

The above concerns only example embodiments of the present disclosure, and of course, the present disclosure may have various other embodiments, and those skilled in the art can make various corresponding modifications and variations according to the present disclosure without departing from the spirit and scope of the present disclosure, and these corresponding modifications and variations are intended to be included within the scope of the appended claims.

What is claimed is:

1. An array substrate comprising a plurality of terminals, a first conductive layer, a second conductive layer, and an insulating later between the first conductive layer and the second conductive layer, wherein
a plurality of first electrode plates and a plurality of second electrode plates are disposed in the first conductive layer and the second conductive layer, respectively, the first electrode plates and the second electrode plates being opposite to each other to form a capacitor structure, and wherein
the terminals are disposed in one of the following ways:
the terminals are disposed in the same layer as the first conductive layer or the second conductive layer; and
the terminals are disposed in the same layer as a third conductive layer between the first conductive layer and the second conductive layer,
wherein the first electrode plates and the second electrode plates comprise through holes exposing the terminals.

2. The array substrate according to claim 1, wherein the terminals are provided in the same layer as the first conductive layer, and an insulating material is filled between the terminal and the first electrode plate.

3. The array substrate according to claim 1, wherein the terminals are provided in the same layer as the third conductive layer between the first conductive layer and the second conductive layer, and leads of the terminals are disposed in the third conductive layer.

4. The array substrate according to claim 1, wherein additional through holes are disposed at positions corresponding to the terminals in respective layers besides the first conductive layer above the terminals to expose the terminals.

5. A display device comprising the array substrate according to claim 1.

6. The array substrate according to claim 1, wherein the terminals are provided in the same layer as the second conductive layer, and wherein an insulating material is filled between the terminal and the second electrode plate.

7. The array substrate according to claim 2, further comprising a fourth conductive layer, wherein leads of the terminals are disposed in the fourth conductive layer and connected to the terminals through vias.

8. The array substrate according to claim 2, wherein additional through holes are disposed at positions corresponding to the terminals in respective layers besides the first conductive layer above the terminals to expose the terminals.

9. A display device comprising the array substrate according to claim 2.

10. The array substrate according to claim 7, wherein additional through holes are disposed at positions corresponding to the terminals in respective layers besides the first conductive layer above the terminals to expose the terminals.

11. A display device comprising the array substrate according to claim 7.

12. The array substrate according to claim 3, wherein additional through holes are disposed at positions corresponding to the terminals in respective layers besides the first conductive layer above the terminals to expose the terminals.

13. A display device comprising the array substrate according to claim 3.

14. The array substrate according to claim 4, wherein an orthographic projection of the through holes and the additional through holes on the base substrate of the array substrate at least partially covers the terminals.

15. The array substrate according to claim 14, wherein the array substrate comprises the base substrate, a buffer layer, a TFT transistor, a planarization layer, an anode metal layer, a pixel defining layer, an organic light-emitting layer, and a cathode, wherein The TFT transistor comprises a source electrode, a drain electrode, a gate electrode, an active layer, and a gate insulating layer, and wherein the first conductive layer, the second conductive layer, and the third conductive layer are selected from at least one of the following layers:
the source electrode or the drain electrode, the gate electrode, the active layer, the anode metal layer, the organic light-emitting layer, and the cathode.

16. A method of manufacturing an array substrate comprising:
forming a plurality of first electrode plates in a first conductive layer;
forming a plurality of second electrode plates opposite to the first electrode plates respectively in a second conductive layer, wherein the first electrode plates and the second electrode plates constitute a capacitor structure; and
forming a plurality of terminals in the first conductive layer or the second conductive layer, or forming a plurality of terminals in a third conductive layer between the first conductive layer and the second conductive layer,
wherein the first electrode plates and the second electrode plates comprise through holes exposing the terminals.

17. The manufacturing method according to claim 16, further comprising forming a plurality of terminals in the first conductive layer, wherein an insulating material is filled between the terminal and the first electrode plate.

18. The manufacturing method according to claim 16, further comprising:
  forming leads of the terminals in a fourth conductive layer, the leads of the terminals connected to the terminals through vias.

19. The manufacturing method according to claim 16, wherein forming a plurality of terminals in a third conductive layer between the first conductive layer and the second conductive layer further comprises:
  forming leads of the terminals in the third conductive layer.

20. The manufacturing method according to claim 16, further comprising forming a plurality of terminals in the second conductive layer, wherein an insulating material is filled between the terminal and the second electrode plate.

\* \* \* \* \*